United States Patent
Hurst, Jr. et al.

[11] Patent Number: 6,147,922
[45] Date of Patent: Nov. 14, 2000

[54] NON-VOLATILE STORAGE LATCH

[75] Inventors: Allan T. Hurst, Jr., Anoka; Jeff S. Sather, Medina; Jason B. Gadbois, Minneapolis, all of Minn.

[73] Assignee: Honeywell, Inc., Morristown, N.J.

[21] Appl. No.: 09/396,189

[22] Filed: Sep. 14, 1999

Related U.S. Application Data

[62] Division of application No. 09/059,871, Apr. 14, 1998.

[51] Int. Cl.[7] .................................................... G11C 7/00
[52] U.S. Cl. ......................... 365/225.5; 365/55; 365/158
[58] Field of Search ................... 365/225.5, 154, 365/158, 50, 52, 55, 66, 74, 189.05, 189.08

[56] References Cited

U.S. PATENT DOCUMENTS

| | | | |
|---|---|---|---|
| 3,573,485 | 4/1971 | Ballard | 307/88 |
| 4,132,904 | 1/1979 | Harai | 307/238 |
| 4,470,873 | 9/1984 | Nakamura | 156/640 |
| 4,751,677 | 6/1988 | Daughton et al. | 365/158 |
| 4,887,236 | 12/1989 | Schloemann | 365/173 |
| 5,595,830 | 1/1997 | Daughton | 428/611 |
| 5,640,343 | 6/1997 | Gallagher et al. | 365/171 |
| 5,650,887 | 7/1997 | Dovek et al. | 360/75 |
| 5,650,958 | 7/1997 | Gallagher et al. | 365/173 |
| 5,654,566 | 8/1997 | Johnson | 257/295 |
| 5,695,864 | 12/1997 | Slonczewski | 428/212 |
| 5,701,222 | 12/1997 | Gill et al. | 360/113 |
| 5,701,223 | 12/1997 | Fontana, Jr. et al. | 360/113 |
| 5,861,328 | 1/1999 | Tehrani et al. | |
| 5,920,500 | 7/1999 | Tehrani et al. | 365/173 |

FOREIGN PATENT DOCUMENTS

| | | |
|---|---|---|
| 0 776 011 A2 | 5/1997 | European Pat. Off. . |
| WO 98/20496 | 5/1998 | WIPO . |

*Primary Examiner*—David Nelms
*Assistant Examiner*—Gene N. Auduong
*Attorney, Agent, or Firm*—Kris T. Fredrick

[57] ABSTRACT

In one aspect of the present invention, a non-volatile latching element is provided that includes one or more magnetic elements therein. By programming the magnetic elements to appropriate resistance values, the latching element assumes a pre-programmed state upon power up. The magnetic elements are preferably programmed using either a one or two layer word line. In another aspect of the present invention, the magnetic elements are formed as pseudo-spin valve structures utilizing only CoFe as the active ferromagnetic layers, with one ferromagnetic layer thinner than the other. This simplifies the design while maintaining the high moment material to achieve large GMR ratios.

11 Claims, 5 Drawing Sheets

NON-VOLATILE STORAGE LATCH

This application is a Division of Ser. No. 09/059,871 filed Apr. 14, 1998.

BACKGROUND OF THE INVENTION

This invention relates to the field of electronic memory devices, and more particularly, to non-volatile memory elements that assume a desired state when power is applied.

Most digital electronic devices use both logic gates and memory elements to implement a desired function. The memory elements are used to store initial, intermediate and/or final data. The logic gates are used to provide and/or receive the data to/from the memory elements, and perform the necessary data manipulation. In a typical digital system, the basic memory elements are bi-stable logic circuits known as latching elements. There are numerous types of latching elements including, for example, D-latches, RS-latches, JK-latches, etc. These latching elements are often combined to form various forms of flip-flops or other storage devices.

Latching elements typically use one or more feedback paths that have an even number of inversions. By providing an even number of inversions, the feedback path reinforces the data state of the latching element. To write a desired state to the latching element, the feedback path is typically overdriven or a switch is provided to temporarily interrupt the feedback path while a new data state is provided to the latching element. The most basic latching element includes a pair of cross-coupled inverters. There are, however, numerous other known implementations.

Conventional latching elements suffer from a number of limitations, some of which are described below. First, the initial state of a latching element is typically unknown. This limitation can cause a number of problems in a circuit or system. For example, the enable signal of selected output buffers is typically either directly or indirectly controlled by the state of a latching element. Because the state of the latching elements are unknown upon power-up, one or more of the output buffers may be enabled simultaneously. This is particularly problematic when the output buffers are coupled to a bidirectional bus where one buffer may attempt to overdrive another, thereby drawing significant power and possibly causing damage to selected circuit elements.

To alleviate this and other problems, many systems require an initialization procedure to be executed shortly after power-up. One purpose of the initialization procedure is to initialize the state of selected latching elements. The initialization procedure may, for example, reset selected latching elements to disable the output buffers of a circuit or system. Generally, the initialization procedure initializes selected latching elements to prepare the device for subsequent processing. Requiring an initialization procedure increases the time required to boot the system.

Another related limitation of many conventional latching elements is that the data stored therein is lost when power is lost or otherwise interrupted. For example, when a personal computer or other data processing system loses power, the data stored in the latching elements are lost. When power is restored, the data processing system assumes an initial state that is unrelated to the state of the data processing system before the power loss. Often, much of the processing that was completed coincident with or prior to the power loss is lost, or must be re-constructed and/or re-executed which can be a time consuming and tedious task.

In high reliability applications, a primary power source and an auxiliary power source may be provided to reduce the likelihood that the latching elements will experience a power loss. In such systems, an auxiliary power source is used when the primary power fails. A limitation of this approach is that significant overhead is required including an auxiliary power source, a power degradation detection mechanism and a power switching mechanism. In addition, the auxiliary power source is often a battery or the like that has a limited lifetime. Therefore, if the primary power source fails for an extended period of time, the auxiliary power source may also fail causing the latching elements to lose the data stored therein.

Another approach for minimizing the loss of data after a power failure is to maintain an audit trail for each transaction submitted to the system. In such a system, an audit trail is periodically written to a non-volatile storage medium such as a magnetic tape or hard drive. The audit trail typically includes a listing of the status of each transaction that is submitted to the processor. If the power fails, the latching elements within the system lose the data stored therein, as described above. However, after power is restored, the audit trail can be used to reconstruct that status of each transaction. Only those transactions that were not completed and stored must be re-submitted for processing. This can significantly reduce the amount of data re-processing required after a power failure. However, significant time and resources are typically required to read the audit trail data and determined the status of each transaction.

It would be desirable, therefore, to provide a latching element that assumes a desired state upon power-up. This may reduce or eliminate the need for an initialization procedure. It would also be desirable to provide a latching element that does not lose data when power is lost or otherwise interrupted. This may reduce the need to provide an auxiliary power source and/or audit trail system or the like.

SUMMARY OF THE INVENTION

The present invention overcomes many of the disadvantages of the prior art by providing a bi-stable latching element that assumes a known initial state upon power up. The present invention also provides a latching element that does not lose data when power is lost or otherwise interrupted. This is accomplished by incorporating one or more magnetic elements into the latching element. The magnetic elements preferably have at least two stable magneto-resistive states. By programming the magnetic elements to appropriate resistance values, the latching element may assume a desired or known initial state upon power up. By programming the magnetic elements each time the latching element is written during normal functional operation, the data stored therein may not be lost when power is lost or otherwise interrupted.

In one illustrative embodiment of the present invention, a latching element is powered by a power supply, and selectively stores a bit of data having one of two stable states. A first magnetic element is interposed between a first portion of the latching element and the power supply. The first magnetic element provides a first magnetically programmable resistance, which causes the latching element to assume a desired one of the two stable states upon power-up of the power supply. A second magnetic element may also be interposed between a second portion of the latching element and the power supply for providing a second magnetically programmable resistance, which may be different from the first magnetically programmed resistance. The second magnetic element may aid the latching element in assuming the desired one of the two stable states upon power-up of the power supply.

In another illustrative embodiment of the present invention, a latching element powered by a first voltage and a second voltage is provided. The latching element includes a first inverting logic element and a second inverting logic element coupled together in a cross-coupled configuration, wherein each of the first and second inverting logic elements has a first power supply terminal and a second power supply terminal. In this illustrative embodiment, a first magnetic element is provided between the first power supply terminal of the first inverting logic element and the first voltage. A second magnetic element is provided between the first power supply terminal of the second inverting logic element and the first voltage. The second power supply terminals of the first and second inverting logic elements are then coupled to the second voltage. Preferably, the first magnetic element is programmed to provide a different resistance than the second magnetic element. Accordingly, an imbalance is created which causes the cross-coupled inverting logic elements to assume a desired state upon power-up.

In another illustrative embodiment of the present invention, the first magnetic element may be connected between the first power supply terminal of the first inverting logic element and the first voltage, and the second magnetic element may be connected between the second power supply terminal of the second inverting logic element and the second voltage. It is contemplated that the first voltage may be positive with respect to the second voltage or vice-versa.

In another illustrative embodiment of the present invention, a conventional latching element may be coupled to a programmable input voltage supply circuit to provide a latching element that assumes a desired or known initial value. The input voltage supply circuit may provide an input voltage to the latching element upon power-up, wherein the input voltage is in one of two states. The input voltage supply circuit preferably includes at least one magnetic element that has at least two stable magneto-resistive states. By programming the magnetic element to have the appropriate resistance value, the input voltage may be adjusted to write the desired state into the latching element upon initial power-up.

The input voltage supply circuit preferably includes both a first resistor and a first magnetic element, wherein the first resistor and a first magnetic element are connected in a first half bridge configuration. The input voltage is then provided from the interconnection of the first resistor and the first magnetic element. By programming the first magnetic element to have the appropriate resistance value, the input voltage may be adjusted to write the desired state into the latching element upon initial power-up. The input voltage supply circuit may further include a second resistor and a second magnetic element, wherein the second resistor and the second magnetic element are connected in a second half bridge configuration. The input voltage may then be provided between the interconnection of the first resistor and the first magnetic element, and the interconnection of the second resistor and the second magnetic means.

To maximize the input voltage amplitude, the first magnetic element is preferably programmed to a predetermined one of the two magnetically programmable resistance values and the second magnetic element is preferably programmed to the opposite one of the two magnetically programmable resistance values. This assumes, of course, that both the first and second magnetic elements are positioned in adjacent legs of the corresponding half bridge circuits. It is contemplated that a selector may be positioned between the input voltage supply circuit and the latching element to selectively provide the input voltage to the storage element. The selector is preferably activated after power-up is underway or complete.

In each of the above illustrative embodiments, it is contemplated that the magnetic elements may be programmed by passing a write current adjacent to the corresponding magnetic elements. The write current magnetizes the magnetic elements in one of two stable magnetic states. The magnetic state controls the resistive value of the corresponding magnetic element. By changing the direction of the write current relative to the corresponding magnetic element, the magnetic state and thus the resistance of the magnetic element may be changed.

As indicated above, some embodiments of the present invention include both first and second magnetic elements wherein it is desirable to program (i.e. write) the first magnetic element into one state and the second magnetic element into the opposite state. In one embodiment of the present invention, the first and second magnetic elements are written into opposite states by using a single write line. The single write line is layed out to approach the first magnetic element from a first direction and the second magnetic element from an opposite direction. In this configuration, write current passing through the write line produces a magnetic field that intersects the first magnetic element from a first direction and the second magnetic element from the opposite direction. Accordingly, the write current writes a first state into the first magnetic element and an opposite state into the second magnetic element. By choosing the direction of the write current, the first and second magnetic elements may be written into desired but opposite states.

In another illustrative embodiment, a write line having two separate layers may be provided. Preferably, an upper layer is provided above the magnetic element and a lower layer is provided below the magnetic element. In one embodiment, current is provided in a single direction, for example from left to right, through a selected one of the two layers. When current is provided through the upper layer, one state is written into the magnetic element. When current is provided through the lower layer, the opposite state is written into the magnetic element.

In another embodiment, the two layers are electrically connected on one side of the magnetic element. In this configuration, current flows through the upper layer, through the connection, and back through the lower layer, or vice-versa. The magnetic fields provided by the upper layer and lower layer are thus additive, thereby increasing the magnetic field at the magnetic element and potentially reducing the current required to switch the device.

In all of the above illustrative embodiments, it is contemplated that the magnetic elements may include AMR type materials, GMR type materials, CMR type materials, spin dependent tunneling type devices, spin valve type devices, or any other magnetic material or device. In a preferred embodiment, the magnetic elements are "pseudo" spin valve structures. A pseudo spin valve structure preferably includes an electrically conducting, magnetically insulating material such as Cu that is sandwiched between two relatively hard active ferromagnetic layers such as CoFe. The two relatively hard active ferromagnetic layers preferably include a top active ferromagnetic layer and a bottom active ferromagnetic layer. The softer permalloy (NiCoFe) cladding layers of a conventional spin valve structure, as described in for example U.S. Pat. No. 5,595,830 to Daughton, are preferably removed.

The top active ferromagnetic layer is preferably the storage layer and the bottom active ferromagnetic layer is preferably a hard layer. To permit the magnetization vector of the top storage layer to rotate in response to a write current, the thickness of the top storage layer is reduced relative to the bottom hard layer. The difference in thickness of the two ferromagnetic layers produces a differential in coercivities of the two layers. In a preferred embodiment, the coercivity of the thinner storage layer is sufficiently small to permit the magnetization vector thereof to rotate in response to a write current. For latching elements, the coercivity of the thinner storage layer is also made sufficiently large to prevent the demagnetization fields of the bottom hard layer from rotating the magnetization vector of the storage layer anti-parallel to the magnetization vector of the hard layer. By eliminating the softer permalloy NiCoFe cladding layers of conventional spin valve structures, the "pseudo" spin valve structure of the present invention simplifies the film stack and hence the deposition process, maintains the high moment material essential to large GMR ratios, and increases the thermal stability of the bit through processing.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
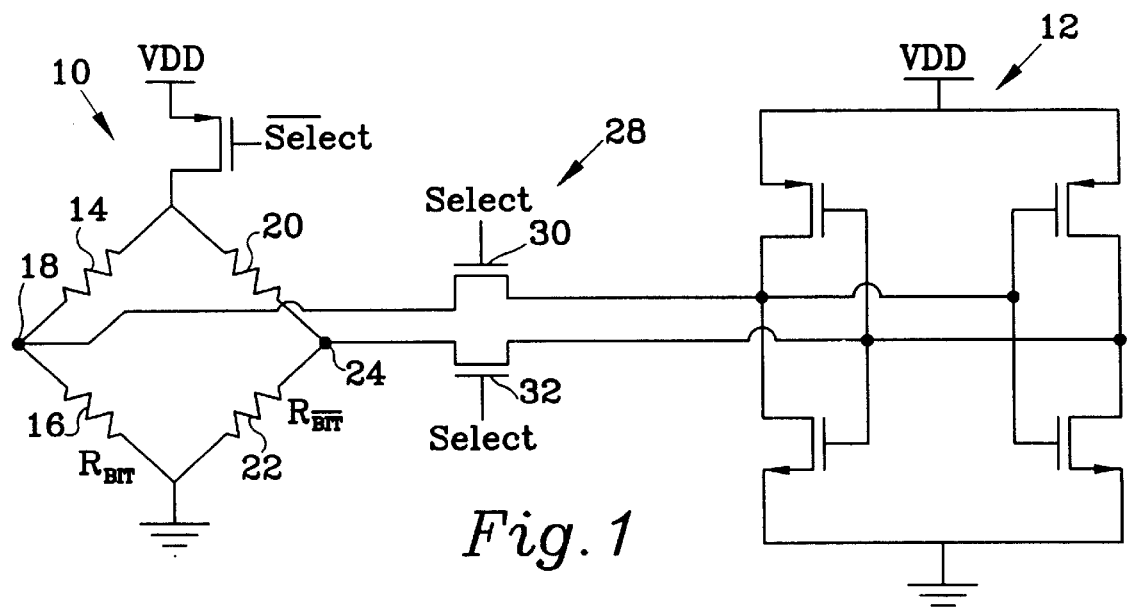
FIG. 1 is a schematic view of a first illustrative embodiment of the present invention including a programmable input voltage supply circuit coupled to a conventional latching element.

FIG. 1 is a schematic view of a first illustrative embodiment of the present invention including a programmable input voltage supply circuit 10 coupled to a conventional latching element 12. The input voltage supply circuit 10 provides an input voltage to the latching element 12 upon power-up, wherein the input voltage assumes one of two states. The input voltage supply circuit 10 includes at least one magnetic element that has at least two stable states. By programming the magnetic element to have the appropriate resistance value, the input voltage may be adjusted to write the desired state into the latching element 12 upon initial power-up.

The input voltage supply circuit 10 preferably includes both a first resistor 14 and a first magnetic element 16, wherein the first resistor 14 and a first magnetic element 16 are connected in a first half bridge configuration. The input voltage is then provided from the interconnection 18 of the first resistor 14 and the first magnetic element 16. By programming the first magnetic element 16 to have the appropriate resistance value, the input voltage may be adjusted to write the desired state into the latching element 12 upon initial power-up.

The input voltage supply circuit 10 may further include a second resistor 20 and a second magnetic element 22, wherein the second resistor 20 and the second magnetic element 22 are also connected in a half bridge configuration. In the embodiment shown, the first resistor 14, first magnetic element 16, second resistor 20 and second magnetic element 22 form a full bridge configuration. Accordingly, the input voltage may be provided between the interconnection 18 of the first resistor 14 and the first magnetic element 16, and the interconnection 24 of the second resistor 20 and the second magnetic element 22. The input voltage must be sufficiently high to overdrive the cross-coupled inverter pair of the latching element 12 to affect a write.

To maximize the input voltage amplitude, the first magnetic element 16 is preferably programmed to a desired one of the two magnetically programmable resistance states and the second magnetic element 22 is programmed to the opposite programmable resistance state. Although not explicitly shown, it is contemplated that both of the magnetic elements 16 and 22 may be provided in the upper legs of the bridge, and the two resistors 14 and 20 may be provided in the lower legs. Likewise, it is contemplated that the second resistor 20 may replace the second magnetic element 22, and vice-versa. In this latter configuration, the maximum input voltage amplitude may be achieved by programming the first magnetic element 16 and the second magnetic element 22 in the same state.

It is contemplated that a selector 28 may be positioned between the input voltage supply circuit 10 and the latching element 12 to selectively provide the input voltage to the latching element 12. As shown, the selector may include a first transistor 30 and a second transistor 32. Preferably, a select signal is provided to the gates of transistors 30 and 32 after power-up is underway or complete.

Figure 2:
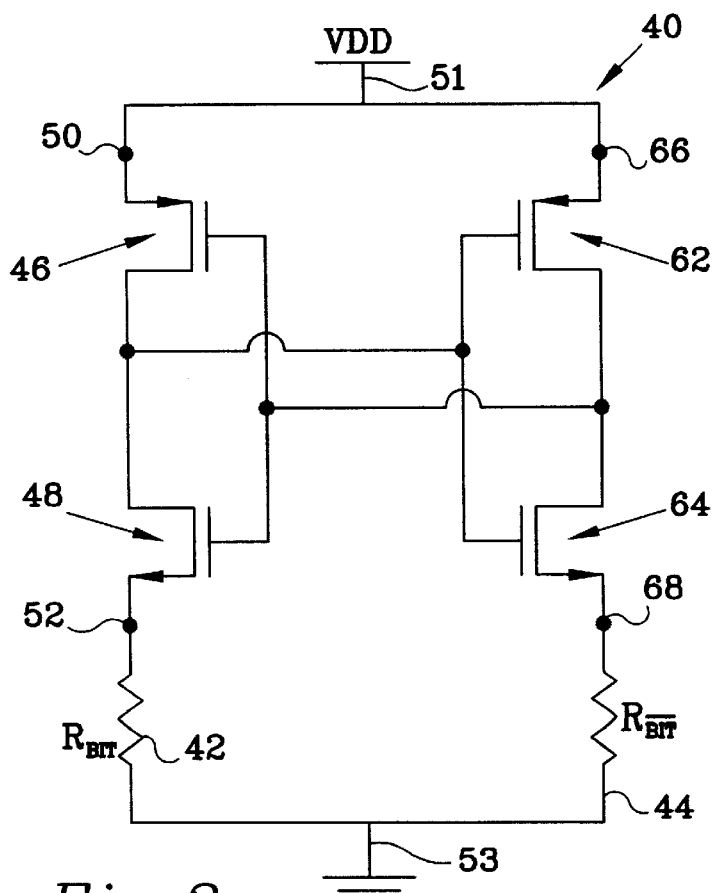
FIG. 2 is a schematic view of another illustrative embodiment of the present invention including a latching element with two magnetic elements therein.

FIG. 2 is a schematic view of another illustrative embodiment of the present invention including a latching element 40 with a first magnetic element 42 and a second magnetic element 44. The latching element 40 includes a first inverter having p-channel transistor 46 and n-channel transistor 48, and a second inverter having p-channel transistor 62 and n-channel transistor 64. The first inverter and the second inverter are coupled together in a well-known cross-coupled configuration.

The first inverter has a first power supply terminal 50 and a second power supply terminal 52. The source of the p-channel transistor 46 is coupled to the first power supply terminal 50, which is coupled directly to a first voltage 51. The source of the n-channel transistor 48 is coupled to the second power supply terminal 52. The first magnetic element 42 is disposed between the second power supply terminal 52 and ground 53 (second voltage). Likewise, the second inverter has a first power supply terminal 66 and a second power supply terminal 68. The source of the p-channel transistor 62 is coupled to the first power supply terminal 66, which is coupled directly to the first voltage 51. The source of the n-channel transistor 64 is coupled to the second power supply terminal 68. The second magnetic element 44 is disposed between second power supply terminal 68 and ground 53.

In this configuration, the first magnetic element 42 is preferably programmed to a different resistance state than the second magnetic element 44. As such, an imbalance is created during power-up of the latching element 40, which causes the cross-coupled inverters to assume a known state.

Figure 3:
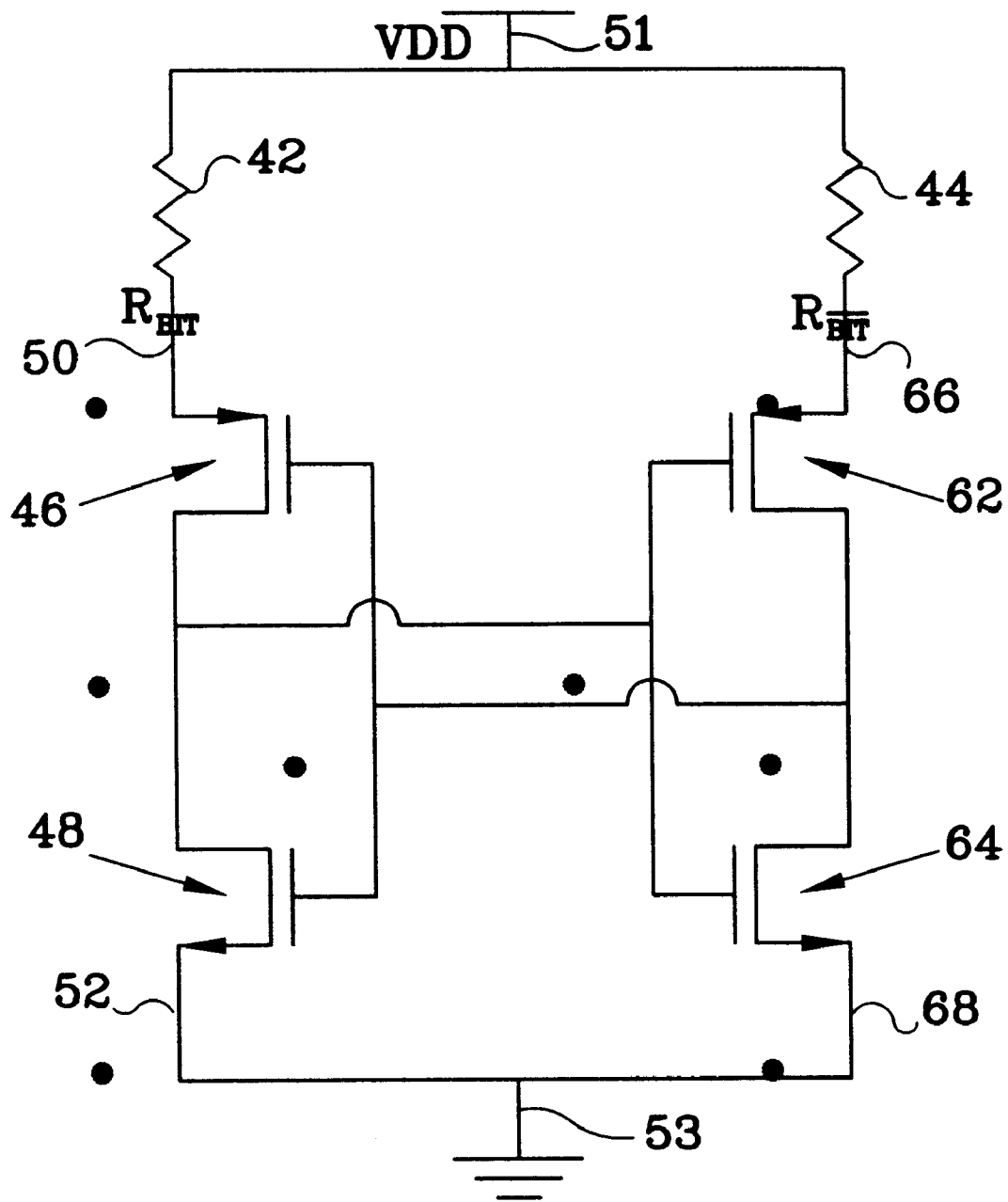
FIG. 3 is a schematic view of yet another illustrative embodiment of the present invention including a latching element with two magnetic elements therein.

FIG. 3 is a schematic view of another illustrative embodiment of the present invention including a latching element having two magnetic elements 42 and 44. In this embodiment, the first magnetic element 42 is connected between the first power supply terminal 50 of the first inverter and the first voltage 51. The second magnetic element 44 is connected between the first power supply terminal 66 of the second inverter and the first voltage 51. Like the embodiment shown in FIG. 2, the first magnetic element 42 is preferably programmed to a different resistance state than the second magnetic element 44. As such, an imbalance is created during power-up of the latching element, which causes the cross-coupled inverters to assume a known state.

Although not explicitly shown, it is contemplated that the first magnetic element 42 may be connected between the first power supply terminal 50 of the first inverter and the first voltage 51, and the second magnetic element 44 may be connected between the second power supply terminal 68 of the second inverter and ground 53. In this configuration, the first magnetic element 42 is preferably programmed with the same resistance state as the second magnetic element 44. As such, an imbalance is created during power-up of the latching element, which causes the cross-coupled inverters to assume a known state.

The cross-coupled inverting logic elements may be fabricated using discrete logic or integrated logic, including any number of integrated circuit technologies including BIPOLAR, CMOS, BICMOS, etc.

Figure 4:
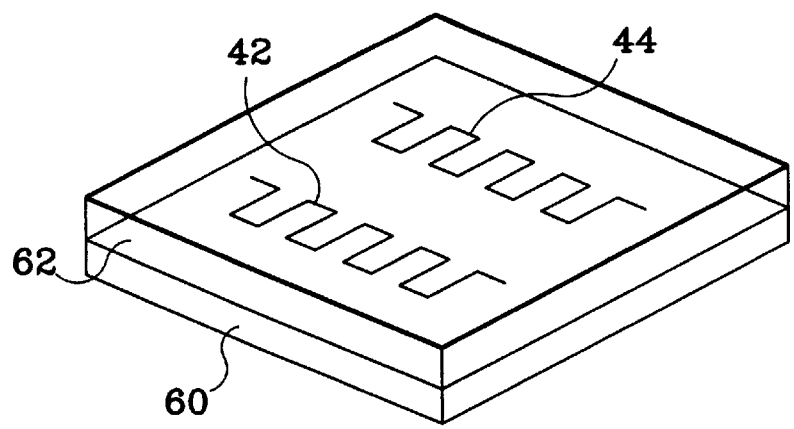
FIG. 4 is a partial perspective view of a latching element having two magnetic elements disposed above the electronic circuitry in accordance with a preferred embodiment of the present invention.

FIG. 4 is a partial perspective view of a latching element having electronic circuitry 60 and two magnetic elements 42 and 44 disposed above the electronic circuitry 60. The electronic circuitry 60 preferably includes selected metal interconnect layers, vias and contacts necessary to interconnect the electronic circuitry to the magnetic elements 42 and 44. By providing the magnetic elements after contact and via processing, higher densities may be achieved as disclosed in commonly assigned U.S. patent application Ser. No. 08/993, 005, filed Dec. 18, 1997, entitled "High Density Magnetic Memory Device and Method of Manufacture Therefor", which is incorporated herein by reference.

Figure 5:
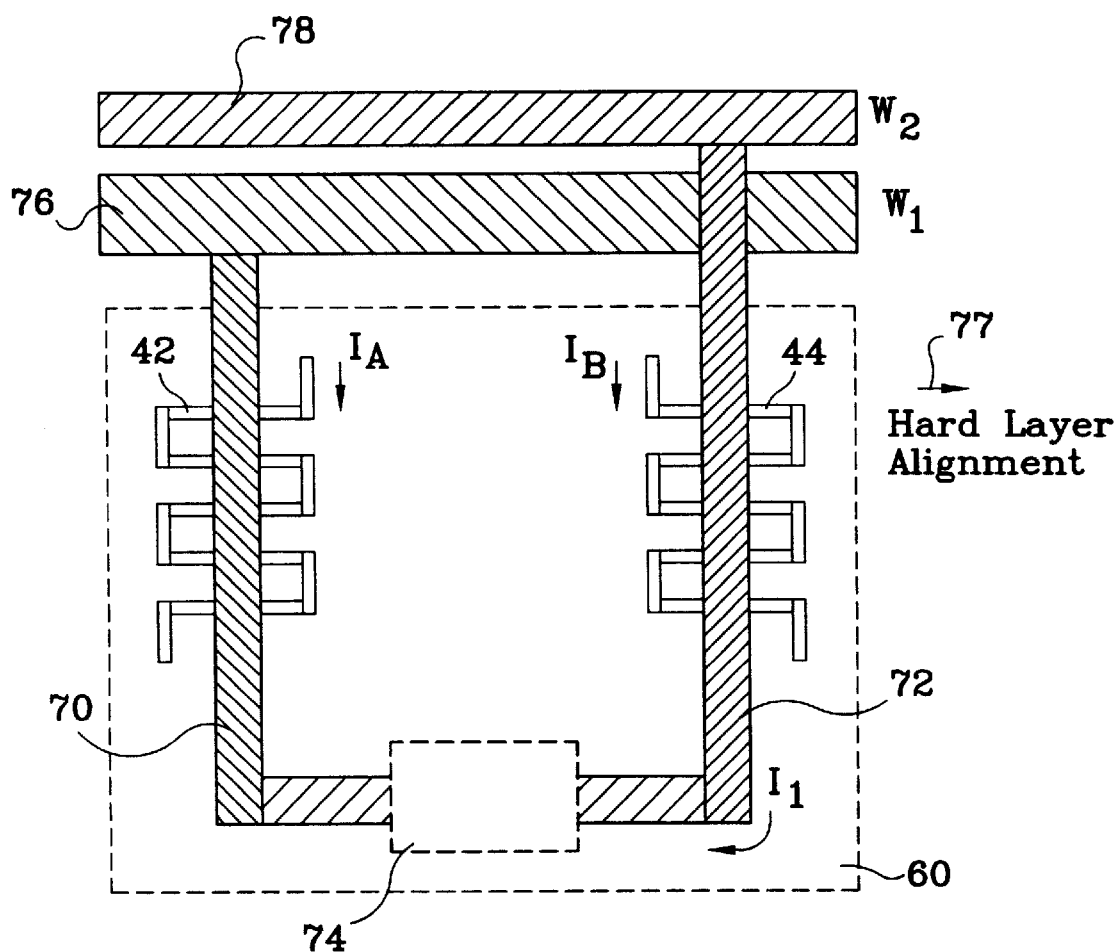
FIG. 5 is a schematic view of a magnetic latching element, showing illustrative write lines overlaying the magnetic elements.

FIG. 5 is a schematic view of a magnetic latching element, having illustrative write lines overlaying the magnetic elements 42 and 44. The electronic circuitry 60 is shown in phantom below the magnetic elements. As indicated above with reference to FIGS. 1–3, the magnetic elements 42 and 44 are preferably programmed to a desired state. In some embodiments, it is desirable to program the magnetic elements 42 and 44 into the same state, while in other embodiments it is desirable to program the magnetic elements 42 and 44 into opposite states.

Most magneto-resistive memory elements can be written into one of two states. This is typically done by providing a write line adjacent to the magnetic elements, and passing a write current through the write line. The write current produces a magnetic field, which intersects the magnetic element in one of two directions. If the magnetic field intersects the magnetic element in a first direction, the magnetic element is written into a first state. If the magnetic field intersects the magnetic element in a second direction, the magnetic element is written into a second state.

Referring specifically to FIG. 5, a first write line 70 is provided over the first magnetic element 42, and a second write line 72 is provided over the second magnetic element 44. A phantom box is shown at 74, which may represent different functions depending on the desired writing scheme. In one embodiment, the phantom box 74 simply connects the first write line 70 and the second write line 72. As such, a write current $I_1$ can be passed down the first write line 72 and back the second write line 74. Assuming the first magnetic element 42 and the second magnetic element 44 each have hard layers that are magnetized in the same direction, for example from left to right as shown at 77, the write current $I_1$ writes a first resistive state to the first magnetic element 42 and an opposite resistive state to the second magnetic element 44. The direction of the write current can be reversed to reverse the state written to the first and second magnetic elements 42 and 44.

In another embodiment, the phantom box 74 may either directly or indirectly connect the first write line 70 and the second write line 72 to a predetermined voltage such as ground. In this embodiment, the first write line 70 and the second write line 72 independently control the write state of the first and second magnetic elements 42 and 44, respectively.

In yet another embodiment, the phantom box 74 may include logic or the like to help control the writing of the first and second magnetic elements 42 and 44. For example, the phantom box 74 may include a switch that selectively connects the first write line 70 and the second write line. This may be particularly useful when the first write signal 76 and the second write signal 78 service more than one latching element. The switch may provide a degree of control over which of the latching elements are written during a particular write cycle.

Figure 6:
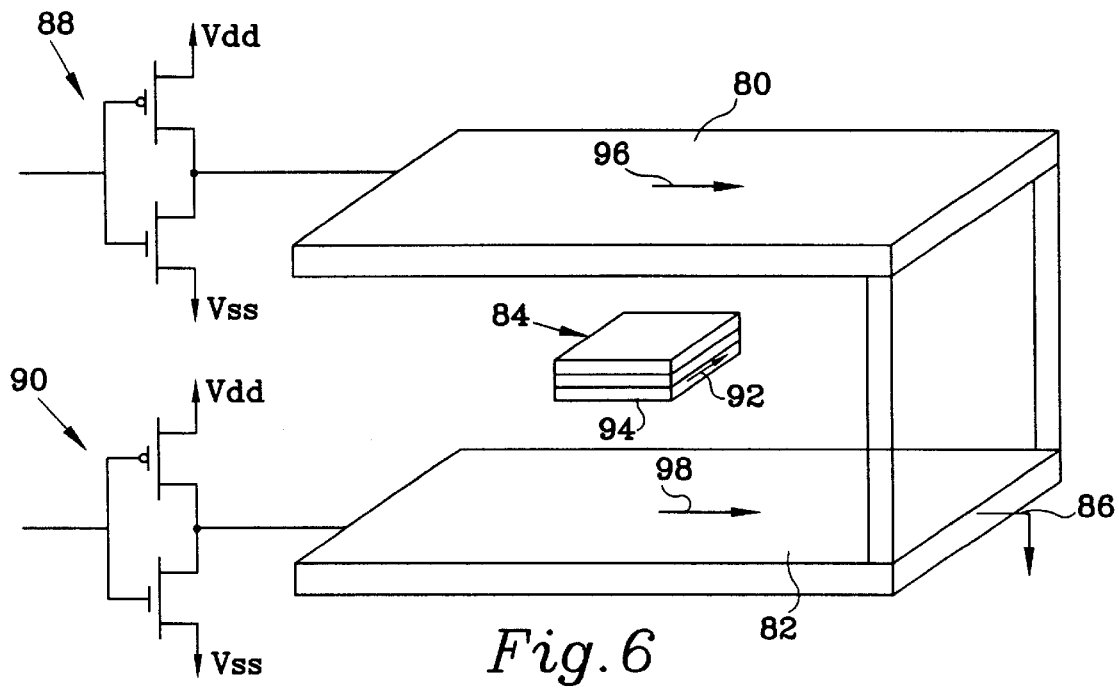
FIG. 6 is a schematic view of an illustrative two layer word line structure for selectively writing a desired state to a magnetic element.

FIG. 6 is a schematic view of an illustrative two-layer word line structure for selectively writing a desired state to a magnetic element. As disclosed above, the magnetic elements may be programmed by passing a write current adjacent to the corresponding magnetic elements. The write current magnetizes the magnetic elements in one of two stable magnetic states. By changing the direction of the write current relative to the magnetization vector of the hard layer of the corresponding magnetic element, the magnetic state of the magnetic element may be changed.

The embodiment shown in FIG. 6 uses a two-layer word line structure to write one of two states to the corresponding magnetic element 84. The two-layer word line includes an upper word line 80 and a lower word line 82, wherein the upper word line 80 is positioned above the magnetic element 84 and the lower word line 82 is positioned below the magnetic element 84. In the embodiment shown, the ends of the upper and lower word lines 80 and 82 are either directly coupled to ground, as shown at 86, or indirectly coupled to ground through a current limiting resistor or the like (not shown). In this configuration, a first driver 88 may provide a write current 96 through the upper word line 80, which produces a magnetic field that is parallel to the illustrative magnetization vector 92 of the hard layer 94, which may write a first state to the magnetic element 84. A second driver 90 may provide a write current 98 through the lower word line 82, which produces a magnetic field that is anti-parallel with the illustrative magnetization vector 92 of the hard layer 94, which may write an opposite state to the magnetic element 84. Preferably, only one of the first and second drivers 88 and 90 is asserted at any given time.

Figure 7:
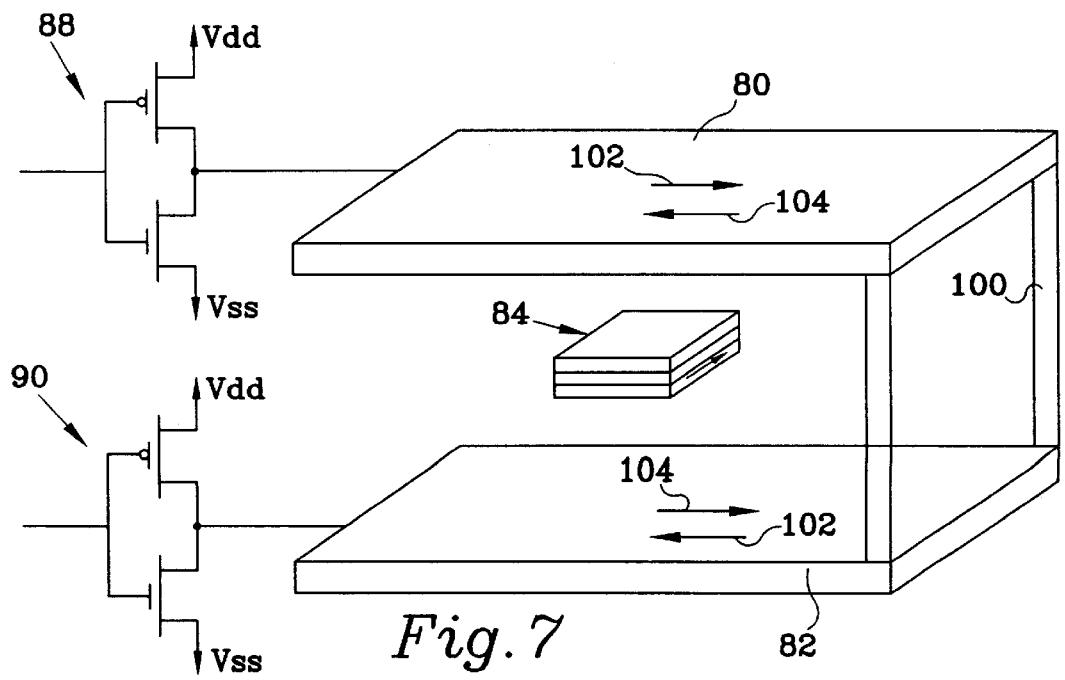
FIG. 7 is a schematic view of yet another two layer word line structure for selectively writing a desired state to a magnetic element.

FIG. 7 is a schematic view of yet another two-layer word line structure for selectively writing a desired state to a magnetic element. This embodiment is similar to the embodiment of FIG. 6, except that the upper word line 80 is electrically connected to the lower word line 82 through a connection, schematically illustrated at 100. To write a first state to the magnetic element 84, the first driver 88 provides a write current 102 to the upper word line 80, through connection 100, through the lower word line 82, and finally to the second driver 90. Because the currents through the upper word line 80 and lower word line 82 are in opposite directions, the magnetic fields provided thereby are additive. This may effectively double the magnetic field at the magnetic element 84 relative to the embodiment shown in FIG. 6, potentially reducing the write current required to write to the magnetic element 84.

To write the opposite state to the magnetic element 84, the second driver 90 may provide a write current 104 to the lower word line 82, through connection 100, through the upper word line 80, and finally to the first driver 88. Again, the magnetic fields provided by current 104 in the lower word line 82 and the upper word line 80 are additive, thereby potentially reducing the write current required to write to the magnetic element 84.

It is contemplated that the above word line structures may include a magnetic keeper to further increase the magnetic field at the magnetic element. An illustrative word line keeper is disclosed in commonly assigned U.S. patent application Ser. No. 08/993,009 filed Jun. 11, 1998, entitled "SELF ALIGNED WORDLINE KEEPER AND METHOD OF MANUFACTURE THEREFOR", which is incorporated herein by reference.

Figure 8A:
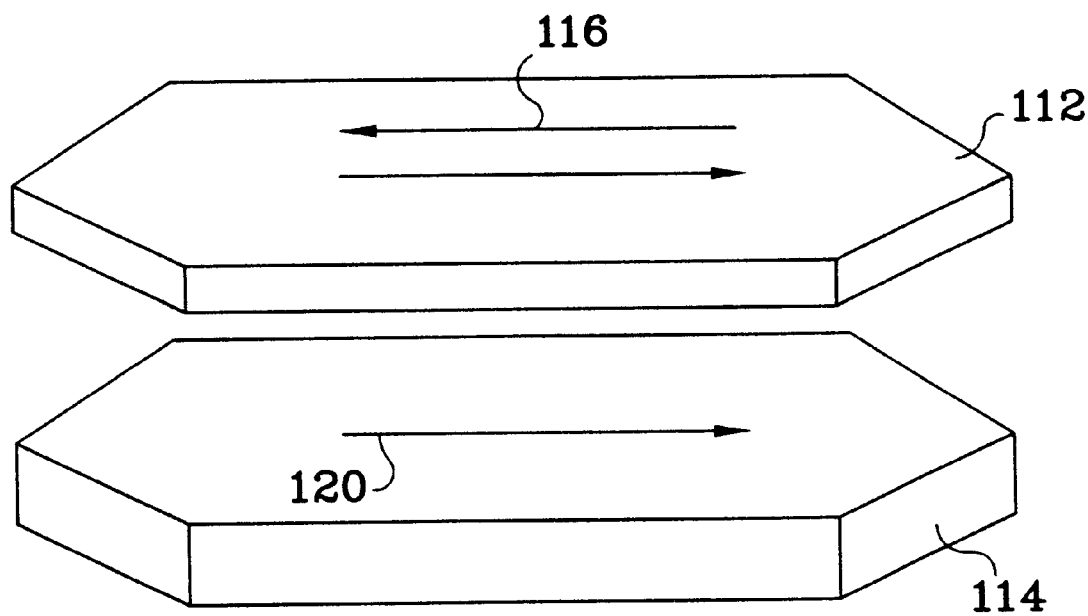
FIG. 8A is an illustrative partial perspective side view of a Pseudo-Spin Valve (PSV) magnetic element in accordance with the present invention.
Figure 8B:
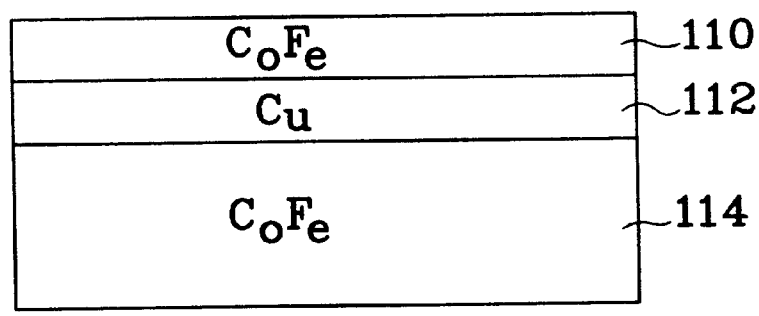
FIG. 8B is an illustrative cross-sectional side view of the Pseudo-Spin Valve (PSV) magnetic element of FIG. 8A.

The magnetic elements are preferably formed using "pseudo" spin valve structures, such as that shown in FIG. 8A and FIG. 8B. Referring specifically to FIG. 8B, the pseudo spin valve structure preferably include an electrically conducting, magnetically insulating layer 110 that is sandwiched between two active ferromagnetic layers 112 and 114. The electrically conducting magnetically insulating layer 110 is preferably formed from Cu or the like, and the two active ferromagnetic layers 112 and 114 are preferably formed from a hard material such as CoFe or the like. The softer permalloy (NiCoFe) cladding layers of a conventional spin valve structure (as described in for example U.S. Pat. No. 5,595,830 to Daughton) are preferably removed, and the bottom CoFe layer is preferably provided directly on a tantalum seed layer (not shown).

In the illustrative embodiment shown in FIG. 8A and FIG. 8B, the top active ferromagnetic layer 112 is a storage layer and the bottom active ferromagnetic layer 114 is a hard layer. To permit the magnetization vector of the top storage layer 112 to rotate in response to a write current, the thickness of the top storage layer 112 is reduced relative to the bottom hard layer 114. The difference in thickness of the two CoFe layers produces a differential in coercivities of the two layers. In a preferred embodiment, the coercivity of the thinner storage layer 112 is made sufficiently large to prevent the demagnetization fields of the bottom hard layer 114 from rotating the magnetization vector 116 of the storage layer 112 anti-parallel to the magnetization vector of the hard layer 114. By eliminating the softer permalloy NiCoFe cladding layers of conventional spin valve structures, the "pseudo" spin valve structure of the present invention simplifies the film stack and hence the deposition process, maintains the high moment material essential to large GMR ratios, and increases the thermal stability of the bit through processing.

Having thus described the preferred embodiments of the present invention, those of skill in the art will readily appreciate that the teachings found herein may be applied to yet other embodiments within the scope of the claims hereto attached.

What is claimed is:

1. Apparatus for writing a first magnetic element to a first state and a second magnetic element to a second state, comprising:

a word line carrying a word line current wherein the word line current produces a magnetic field, said word line extending adjacent to the first and second magnetic elements and oriented such that the magnetic field at the first magnetic element writes the first state into the first magnetic element, and such that the magnetic field at the second magnetic element writes the second state into the second magnetic element; and word line current providing means coupled to the word line for selectively providing the word line current.

2. Apparatus according to claim 1 wherein the word line extends adjacent the first magnetic element, loops back, and extends over the second magnetic element.

3. Apparatus for writing a magnetic element to a desired one of two states, comprising:

a first word line carrying a first word line current, said first word line extending adjacent one side of the magnetic element;

a second word line carrying a second word line current, said second word line extending adjacent an opposite side of the magnetic element parallel to said first word line;

word line current providing means coupled to said first word line and said second word line for selectively providing the first word line current to write the magnetic element to a first one of the two states and for selectively providing the second word line current to write the magnetic element to a second one of the two states.

4. Apparatus according to claim 3 wherein the first word line is positioned above the magnetic element, and the second word line is positioned below the magnetic element.

5. An apparatus for writing a magnetic element to a desired one of two states comprising a word line extending adjacent to at least two opposite sides of the magnetic element, said word line on one side of the magnetic element being substantially parallel to the word line on the opposite side of the magnetic element.

6. Apparatus according to claim 5 further comprising a word line current providing means for providing a word line current in a first direction through the word line to write the magnetic element to a first one of the two states, and for providing a word line current in an opposite direction through the word line to write the magnetic element to a second one of the two states.

7. Apparatus according to claim 6 wherein the word line extends adjacent to the top and bottom sides of the magnetic element.

8. A method for writing a first magnetic element to a first state and a second magnetic element to a second state, comprising the step of:

passing a word line current in a first direction adjacent the first and second magnetic elements, wherein the word line current extends past a first side of the first magnetic element and an opposite side of the second magnetic element such that the magnetic field produced by the word line current at the first magnetic element writes the first state into the first magnetic element, and such that the magnetic field produced by the word line current at the second magnetic element writes the second state into the second magnetic element.

9. A method according to claim 8 further comprising the step of:

passing a word line current in a second opposite direction adjacent the first and second magnetic elements such that the magnetic field produced by the word line current at the first magnetic element writes the second state into the first magnetic element, and such that the magnetic field produced by the word line current at the second magnetic element writes the first state into the second magnetic element.

10. A method for writing a magnetic element to a desired one of two states, comprising:

providing a first word line current adjacent a first side of the magnetic element to write the magnetic element to a first one of the two states;

providing a second word line current adjacent an opposite side of the magnetic element, parallel to the first word line current, to write the magnetic element to a second one of the two states.

11. A method for writing a magnetic element to a desired one of two states:

providing a word line current adjacent a first side of the magnetic element and then looping back to extend adjacent an opposite side of the magnetic element, parallel to the first word line current on the first side of the magnetic element, to write the magnetic element to a first one of the two states; and providing a word line current adjacent the opposite side of the magnetic element and then looping back to extend adjacent the first side of the magnetic element, parallel to the first word line current on the second side of the magnetic element, to write the magnetic element to a second one of the two states.

* * * * *

UNITED STATES PATENT AND TRADEMARK OFFICE
CERTIFICATE OF CORRECTION

PATENT NO. : 6,147,922
DATED : November 14, 2000
INVENTOR(S) : Allan T. Hurst, Jr. and Jeff S. Sather It is certified that error appears in the above-identified patent and that said Letters Patent is hereby corrected as shown below:

<u>Title page,</u>
Item [75], Inventors, please delete "Jason B. Gadbois".

Signed and Sealed this

Sixteenth Day of March, 2004

JON W. DUDAS
*Acting Director of the United States Patent and Trademark Office*